United States Patent
Li et al.

(10) Patent No.: US 10,910,574 B2
(45) Date of Patent: Feb. 2, 2021

(54) DISPLAY PANEL, TERMINAL, AND METHOD FOR DISPLAY CONTROL

(71) Applicant: Beijing Xiaomi Mobile Software Co., Ltd., Beijing (CN)

(72) Inventors: Guosheng Li, Beijing (CN); Zhongsheng Jiang, Beijing (CN); Xiaoxing Yang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 15/670,895

(22) Filed: Aug. 7, 2017

(65) Prior Publication Data

US 2018/0062098 A1 Mar. 1, 2018

Related U.S. Application Data

(63) Continuation of application No. PCT/CN2016/096741, filed on Aug. 25, 2016.

(51) Int. Cl.
*H01L 51/44* (2006.01)
*G02F 1/133* (2006.01)
(Continued)

(52) U.S. Cl.
CPC ........ *H01L 51/442* (2013.01); *G02F 1/13318* (2013.01); *G02F 1/13471* (2013.01);
(Continued)

(58) Field of Classification Search
CPC ............... H01L 51/442; H01L 27/1214; H01L 27/14621; H01L 27/3232; H01L 27/3234;
(Continued)

(56) References Cited

U.S. PATENT DOCUMENTS 6,489,631 B2  12/2002  Young et al.
6,507,083 B1 *  1/2003  Tian ................. H01L 27/14623
                                                257/432
(Continued)

FOREIGN PATENT DOCUMENTS

CN   101221962 A   7/2008
CN   101677104 A   3/2010
(Continued)

OTHER PUBLICATIONS

Russian Office Action dated Apr. 25, 2018 for corresponding RU Patent Application No. 2017125941/08(044638) including English translation, 8 pages.
(Continued)

*Primary Examiner* — Chanh D Nguyen
*Assistant Examiner* — Ngan T. Pham-Lu
(74) *Attorney, Agent, or Firm* — Arch & Lake LLP

(57) ABSTRACT

A display panel, terminal, and method are provided for display control in the technical field of display. The display panel may include: an image display panel; an optical sensor array in the image display panel. The optical sensor array may include a plurality of optical sensors arranged in an array. The display further includes a grating panel disposed above the optical sensor array. The grating panel includes an optical shading area that is not overlapped with an optical sensing area of the optical sensors.

20 Claims, 14 Drawing Sheets

100-display panel
120-image display panel
122-optical sensor array/optical sensing area
140-grating panel
142-optical shading area

(51) Int. Cl.
*H01L 27/32* (2006.01)
*G02F 1/1347* (2006.01)
*H01L 27/12* (2006.01)
*H01L 27/146* (2006.01)

(52) U.S. Cl.
CPC .... *H01L 27/1214* (2013.01); *H01L 27/14621* (2013.01); *H01L 27/3232* (2013.01); *H01L 27/3234* (2013.01); *H01L 27/14625* (2013.01); *H01L 27/3225* (2013.01)

(58) Field of Classification Search
CPC .......... H01L 27/14625; H01L 27/3225; G02F 1/13318; G02F 1/13471
USPC ........................................................ 345/103
See application file for complete search history.

(56) References Cited

U.S. PATENT DOCUMENTS

| | | | |
|---|---|---|---|
| 2001/0052597 | A1 | 12/2001 | Young et al. |
| 2004/0132262 | A1* | 7/2004 | Ayabe ............... H01L 27/14603 438/428 |
| 2005/0248264 | A1 | 11/2005 | Cok |
| 2006/0011913 | A1 | 1/2006 | Yamazaki |
| 2009/0284693 | A1* | 11/2009 | Adachi ............. G02F 1/133555 349/98 |
| 2016/0293670 | A1* | 10/2016 | Chen .................... H01L 27/322 |
| 2018/0239454 | A1* | 8/2018 | Wu ....................... G06F 3/0416 |

FOREIGN PATENT DOCUMENTS

| | | | |
|---|---|---|---|
| CN | 102338946 | A | 2/2012 |
| CN | 203397025 | U | 1/2014 |
| CN | 104347680 | A | 2/2015 |
| CN | 104393024 | A | 3/2015 |
| CN | 104570449 | * | 4/2015 |
| CN | 104570449 | A | 4/2015 |
| CN | 104914602 | A | 9/2015 |
| CN | 105448825 | A | 3/2016 |
| EP | 2237104 | A1 | 10/2010 |
| JP | 2004104203 | A | 4/2004 |
| JP | 2006065305 | A | 3/2006 |
| JP | 2006253236 | A | 9/2006 |
| JP | 2010056303 | A | 3/2010 |
| JP | 2010091610 | A | 4/2010 |
| JP | 2012098732 | A | 5/2012 |
| KR | 20120047757 | A | 5/2012 |
| RU | 2447470 | C2 | 3/2012 |
| WO | 2009096063 | A1 | 8/2009 |

OTHER PUBLICATIONS

International Search Report and Written Opinion issued in corresponding International Application No. PCT/CN2016/096741, dated Mar. 17, 2017, 13 pages.
Extended European Search Report issued in corresponding European Application No. 17186050.5, dated Feb. 20, 2018, 7 pages.
Communication pursuant to Article 94(3) EPC issued in corresponding European Application No. 17186050.5, dated Jan. 31, 2019, 6 pages.
Notification of Reasons for Refusal (including English translation) issued in corresponding Japanese Application No. 2017-516348, dated Dec. 18, 2018, 9 pages.
Notice of Allowance issued to Japanese Patent Application No. 2017-516348, dated Mar. 10, 2020 with English translation, (5p).
First Office Action issued to Korean Patent Application No. 10-2018-7030488 dated Mar. 17, 2020 with English translation (22p).

* cited by examiner 100-display panel
120-image display panel
122-optical sensor array/optical sensing area
140-grating panel
142-optical shading area

DISPLAY PANEL, TERMINAL, AND METHOD FOR DISPLAY CONTROL

CROSS-REFERENCE TO RELATED APPLICATION

This application is based on and claims priority to Patent Application No. PCT/CN2016/096741 filed on Aug. 25, 2016, which is incorporated herein by reference in its entirety.

FIELD

The present disclosure generally relates to the technical field of display, and more particularly to a display panel, terminal, and method for display control.

BACKGROUND

A camera may be a common infrastructure component of a mobile terminal. The camera may be used for collecting images.

In related art, optical sensors for collecting images may be disposed on a display panel of the mobile terminal, and may be a substitute for the camera mounted in a pinhole disposed on a frame area of the mobile terminal.

SUMMARY

In order to solve the problems that images collected by the optical sensors for collecting images in the display panel of the mobile terminal have bad contrast ratio, bad saturability, and bad display quality, the present disclosure provides a display panel, terminal, and method for display control. The technical solutions are as follows.

According to a first aspect of the present disclosure, a display panel is provided. The display panel may include: an image display panel; an optical sensor array in the image display panel, wherein the optical sensor array may include a plurality of optical sensors arranged in an array; and a grating panel above the optical sensor array, wherein the grating panel has an optical shading area which is not overlapped with an optical sensing area of the optical sensors.

According to a second aspect of the present disclosure, a terminal is provided. The terminal may include the display panel according to the first aspect of the present disclosure.

According to a third aspect of the present disclosure, a method for display control in a terminal including the display panel according to the first aspect of the present disclosure is provided. The method may include: controlling, by the liquid crystal grating control circuitry, the liquid crystal grating layer of the grating panel to convert from an optical leaking state to an optical shading state during the optical sensor array is in operation.

BRIEF DESCRIPTION OF THE DRAWINGS

In order to explain the technical solution of the embodiments of the present disclosure, the accompanying drawings incorporated in the detail description will be introduced in the followings. Obviously, the accompanying drawings described hereinafter are merely exemplary embodiments of the present disclosure, and an ordinary person skilled in the art may obtain other accompanying drawings according to these accompanying drawings without creative work.

DETAILED DESCRIPTION

Reference will now be made in detail to example embodiments, examples of which are illustrated in the accompanying drawings. The following description refers to the accompanying drawings in which same numbers in different drawings represent same or similar elements unless otherwise described. The implementations set forth in the following description of example embodiments do not represent all implementations consistent with the present disclosure. Instead, they are merely examples of devices and methods consistent with aspects related to the present disclosure as recited in the appended claims.

Two image display panels may be introduced before introducing and illustrating embodiments of the present disclosure. The two image display panels are Organic Light Emitting Display (OLED) panel and Liquid Crystal Display (LCD) panel.

Figure 1A:
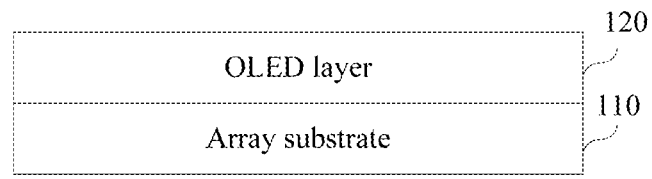
FIG. 1A is a structure diagram illustrating an image display panel according to one or more embodiments of the present disclosure.

Referring to FIG. 1A, FIG. 1A is a structure diagram illustrating an OLED panel. As shown in FIG. 1A, the OLED panel may include an array substrate 110 and an OLED layer 120 above the array substrate 110.

The OLED layer 120 may include x*n pixel units, and each pixel unit may include y subpixel units. Namely, the OLED layer may include m*n subpixel units, wherein m=x*y. Usually, the pixel unit may include three subpixel units, which are Red (R) subpixel unit, Green (G) subpixel unit, and Blue (B) subpixel unit. In some embodiments, the pixel unit may include 4 subpixel units, which are Red (R) subpixel unit, Green (G) subpixel unit, Blue (B) subpixel unit, and White (W) subpixel unit. Namely, the value of y may be 3 or 4. Wherein, m, n, x, and y may be positive integers.

Accordingly, the array substrate 110 may include m*n subpixel units corresponding to the subpixel units of the OLED layer 120.

The array substrate 110 may provide a driving electric field for the OLED layer 120. Organic semiconductor materials and luminescent materials in the OLED layer 120 may be driven by the electric field to irradiate, such that the display of an image may be implemented.

Figure 1B:
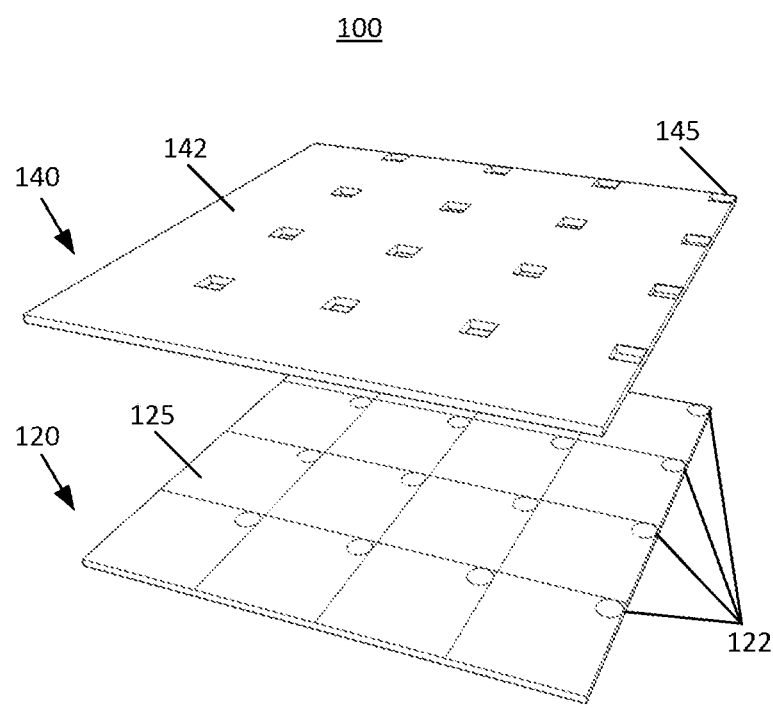
FIG. 1B is an exploded view diagram illustrating an image display panel according to one or more embodiments of the present disclosure.

FIG. 1B is an exploded view diagram illustrating an image display panel according to one or more embodiments of the present disclosure. In FIG. 1B, the display panel 100 includes an image display panel 120 and a grating panel 140 disposed on the image display panel 120. The image display panel 120 includes an optical sensor array 122 disposed on the optical sensing area 125. The grating panel 140 includes optical shading area 142 and scattered openings 145 disposed on the grating panel 140. The optical shading area 142 is not overlapped with the optical sensor array 122.

Figure 2A:
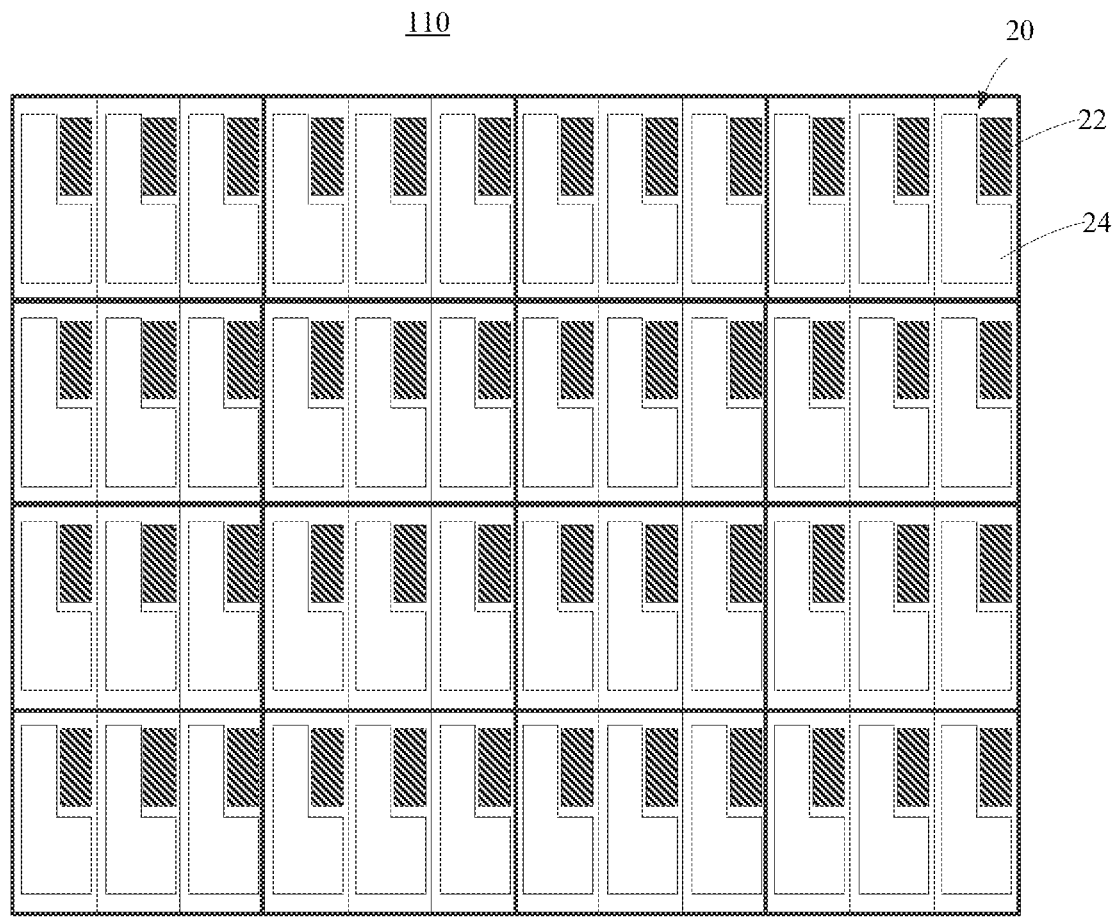
FIG. 2A is a diagram illustrating an arrangement style of pixel units of an array substrate.

FIG. 2A schematically illustrates an arrangement style of pixel units of the array substrate 110. As shown in FIG. 2A, this area may include 4*4 pixel units (namely 16 pixel units). Each pixel unit may include three subpixel units 20. 16 pixel units may include 48 subpixel units. The subpixel units 20 may include respective Thin Film Transistor (TFT) areas 22 and transparent electrode areas 24.

It should be noted that, FIG. 2A only illustrates a local area of the array substrate 110. The array substrate 110 may include a plurality of areas shown by FIG. 2A. The arrangement style shown in FIG. 2A is illustrative only, and is not intended to limit the present disclosure.

The position of the optical sensor array may have two different cases according to the structure of the OLED panel.

1. The optical sensor array may be disposed on the same layer as the array substrate 110.

Figure 2B:
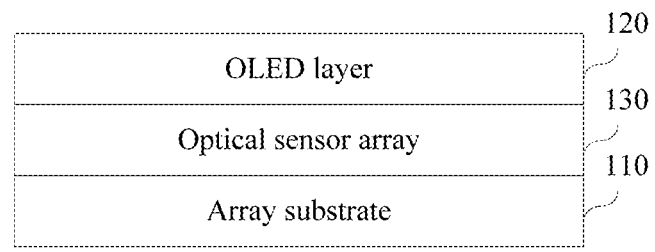
FIG. 2B is a structure diagram illustrating an image display panel according to one or more embodiments of the present disclosure.

2. The optical sensor array 130 may be disposed between the array substrate 110 and the OLED layer 120, as shown in FIG. 2B.

Here, the optical sensor array may include a*b optical sensors, and each optical sensor may be disposed in the TFT area of a corresponding subpixel unit. Wherein, a≤m, b≤n, and a and b may be positive integers.

Figure 2C:
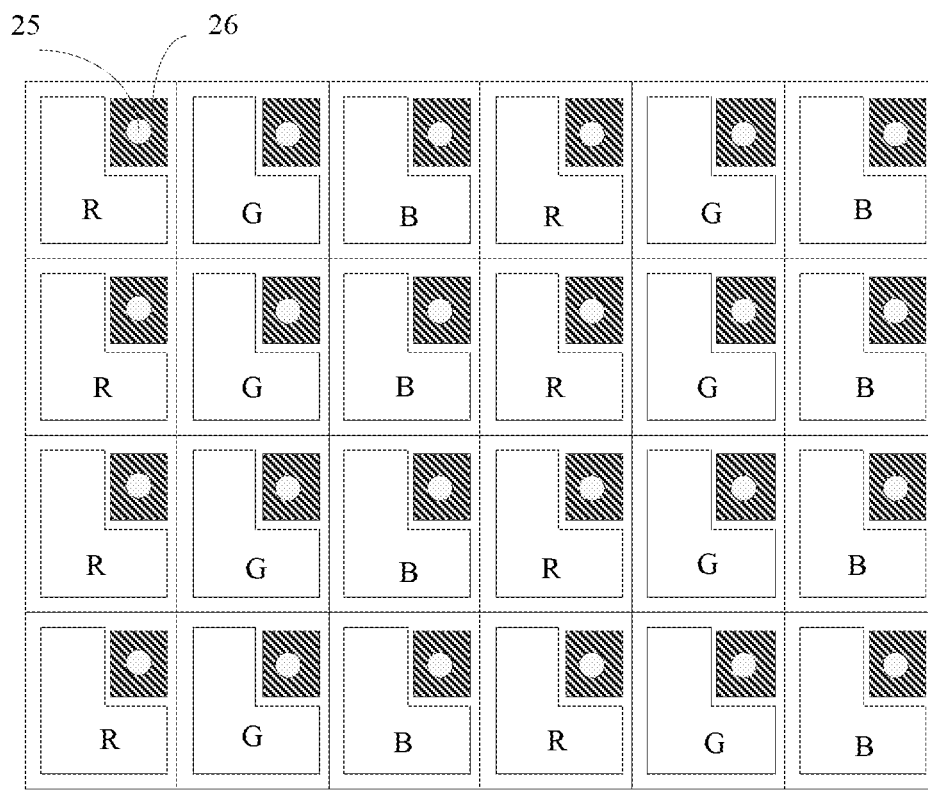
FIG. 2C is a diagram illustrating a position of an optical sensor according to an exemplary embodiment.

In the case that the number of the optical sensors is equal to the number of the subpixel units of the array substrate (namely, a=K*m, b=n, wherein K=1), one optical sensor in the optical sensor array may correspond to one subpixel unit in the array substrate, namely each subpixel unit may have a corresponding optical sensor. As shown in FIG. 2C, each TFT area 26 may have a corresponding optical sensor 25.

In the case that the number of the optical sensors is less than the number of the subpixel units of the array substrate (namely a<K*m, b≤n, or a≤K*m, b=n, or a=K*m, b<n, wherein K=1), the optical sensors may correspond to a portion of the subpixel units of the array substrate.

Figure 3A:
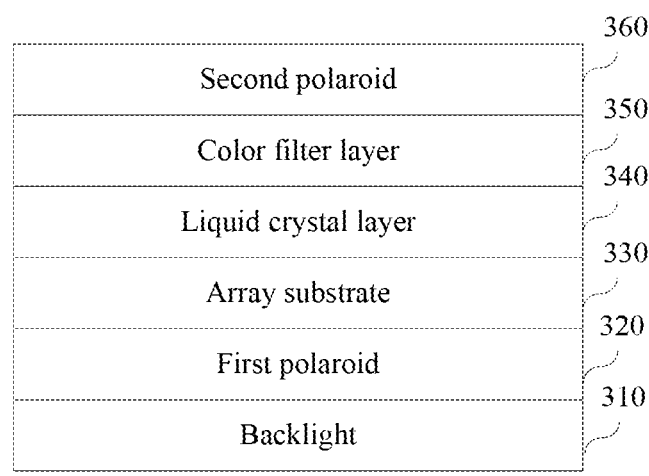
FIG. 3A is a structure diagram illustrating an image display panel according to one or more embodiments of the present disclosure.

FIG. 3A is a structure diagram illustrating an image display panel. As shown in FIG. 3A, the LCD panel may include a backlight 310, a first polaroid 320 above the backlight 310, an array substrate 330 above the first polaroid 320, a liquid crystal layer 340 above the array substrate 330, a color filter layer 350 above the liquid crystal layer 340, and a second polaroid 360 above the color filter layer 350.

The backlight 310 may be configured to provide backlight for the LCD panel. The backlight 310 may include, but not limit to, anyone of an Electro Luminescent (EL), a Cold Cathode Fluorescent Lamp (CCFL), and a Light Emitting Diode (LED).

The first polaroid 320 and the second polaroid 360 may be used to allow light in a certain direction to pass through. The optical leaking axis of the first polaroid 320 and the optical leaking axis of the second polaroid 360 may be orthogonal.

The array substrate 330 may include x*n pixel units, and each pixel unit may include y subpixel units. Namely, the OLED layer may include m*n subpixel units, wherein m=x*y. Usually, the pixel unit may include three subpixel units, which are R subpixel unit, G subpixel unit, and B subpixel unit. In some embodiments, the pixel unit may include 4 subpixel units, which are R subpixel unit, G subpixel unit, B subpixel unit, and W subpixel unit. Namely, the value of y may be 3 or 4.

The arrangement style of pixel units of the array substrate 330 may be shown by FIG. 2A, which will not be described again. The backlight provided by the backlight 310 may be able to pass through the transparent electrode areas 24 and cannot pass through the TFT areas 22.

Liquid crystal molecules of the liquid crystal layer 340 may be controlled by the TFT areas 22 of the array substrate 330 to perform rotation. Different amount of light may be allowed to pass through based on the different rotation angle, such that the display gray scales of the pixel units may be formed.

The color filter layer 350 may allow the LCD panel to present colorful pictures. The color filter layer 350 may include three different colors (e.g., R, G, B) of filter areas arranged in an array. One filter area may correspond to one subpixel unit of the array substrate 330.

The light generated by the backlight 310 may pass from bottom to top through the first polaroid 320, the transparent electrode areas of the array substrate 330, the liquid crystal layer 340, the color filter layer 350, and the second polaroid 360. The voltage generated by the array substrate 330 may control the rotation of the liquid crystal molecules of the liquid crystal layer 340. The liquid crystal layer 340 may change the brightness of the light by rotating the liquid crystal molecules, such that the different subpixel units corresponding to three different colors (R, G, B) of the color filter layer 350 may generate different gray scales. Accordingly, the display of an image may be implemented.

The position of the optical sensor array may have three different cases according to the structure of the LCD panel.

1. The optical sensor array may be disposed on the same layer as the array substrate.

Figure 3B:
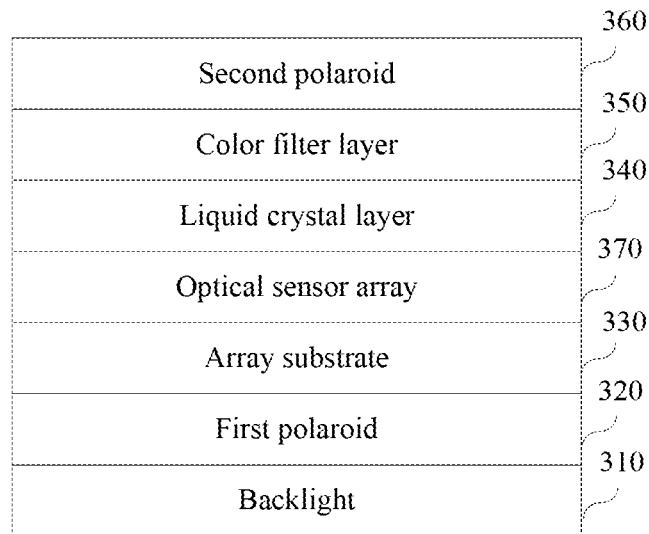
FIG. 3B is a structure diagram illustrating an image display panel according to one or more embodiments of the present disclosure.

2. The optical sensor array 370 may be disposed between the array substrate 330 and the liquid crystal layer 340, as shown in FIG. 3B.

Figure 3C:
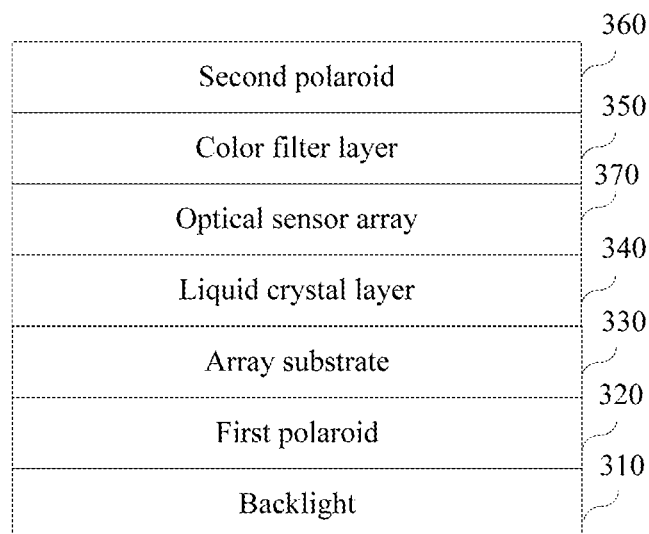
FIG. 3C is a structure diagram illustrating an image display panel according to one or more embodiments of the present disclosure.

3. The optical sensor array 370 may be disposed between the liquid crystal layer 340 and the color filter layer 350, as shown in FIG. 3C.

Here, the optical sensor array may include a*b optical sensors, and each optical sensor may be disposed in the TFT area of a corresponding subpixel unit. Wherein, a≤m, b≤n, and a and b may be positive integers.

In the case that the number of the optical sensors is equal to the number of the subpixel units of the array substrate (namely, a=K*m, b=n, wherein K=1), one optical sensor in the optical sensor array may correspond to one subpixel unit in the array substrate, namely each subpixel unit may have a corresponding optical sensor. As shown in FIG. 2C, each TFT area 26 may have a corresponding optical sensor 25.

In the case that the number of the optical sensors is less than the number of the subpixel units of the array substrate (namely a<K*m, b<n, or a<K*m, b=n, or a=K*m, b<n, wherein K=1), the optical sensors may correspond to a portion of the subpixel units of the array substrate.

Figure 4:
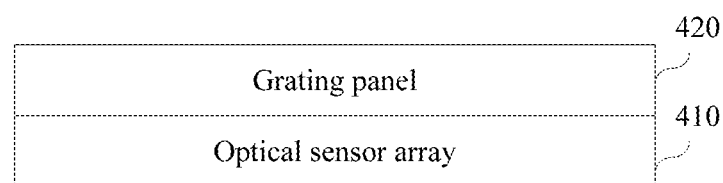
FIG. 4 is a structure diagram illustrating a display panel according to one or more embodiments of the present disclosure.

FIG. 4 is a structure diagram illustrating a display panel according to one or more embodiments of the present disclosure. The display panel may be a display panel of an electronic device such as a cellphone, a tablet computer, a laptop and the like. As shown in FIG. 4, the display panel may include: an image display panel (not shown); an optical sensor array 410 in the image display panel, wherein the optical sensor array 410 may include a plurality of optical sensors arranged in an array; and a grating panel 420 above the optical sensor array 410, where the grating panel 420 has an optical shading area that is not overlapped with an optical sensing area of the optical sensors.

The optical shading area of the grating panel is not overlapped with the optical sensing area of the optical sensors. Namely, the optical shading area of the grating panel and the optical sensing area of the optical sensors may be complementary. The area which is not shaded by the optical shading area of the grating panel may be the optical sensing area of the optical sensors. The optical sensing area of the optical sensors is not the optical shading area of the grating panel. The optical sensing area of the optical sensors and the optical shading area of the grating panel may complement each other. The optical sensing area of the optical sensors adding the optical shading area of the grating panel may be the display area of the display panel. In some embodiments, the optical shading area and the optical sensing area may have a predetermined minimum overlap that is based on the structure of the grating panel and the optical sensors.

Figure 5:
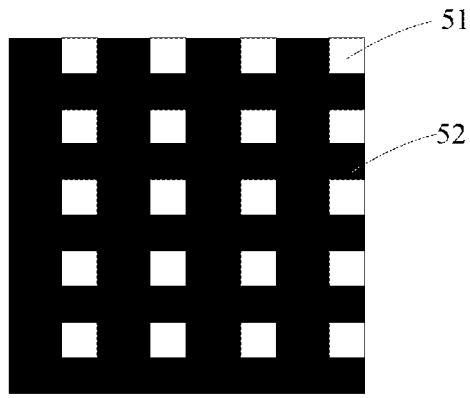
FIG. 5 is a diagram illustrating a display area of a display panel according to one or more embodiments of the present disclosure.

FIG. 5 is a diagram illustrating a display area of a display panel. The blank portion may be the optical sensing area 51 of the optical sensors. The black portion may be the optical shading area 52 of the grating panel. The optical sensing area 51 of the optical sensors adding the optical shading area 52 of the grating panel may be the display area of the display panel.

Here, FIG. 5 only illustrates a local area of the display area of the display panel. The display area may be consisted of a plurality of areas shown by FIG. 5. The display area shown in FIG. 5 is illustrative only, and is not intended to limit the present disclosure.

Above all, in the display panel according to one or more embodiments of the present disclosure, the grating panel may be disposed above the optical sensor array. Because the optical shading area of the grating panel is not overlapped with the optical sensing area of the optical sensors, the optical shading area makes the area outside the optical sensing area to be light-tight. The optical shading area may prevent light diagonally against the optical sensors from passing through and allow light perpendicular to the optical sensors to pass through so as to reduce light that is not the light perpendicular to the optical sensors. Accordingly, the contrast ratio and saturability of the images collected by the optical sensors may be improved, such that the quality of the images can be guaranteed.

In one or more embodiments, the image display panel may be an OLED panel. The optical sensor array may be disposed on a same layer as the array substrate or may be disposed between the array substrate and the OLED layer. The position of the grating panel in the display panel may have two different cases.

Figure 6A:
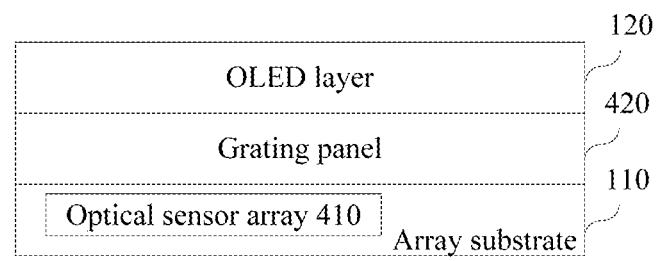
FIG. 6A is a structure diagram illustrating a display panel according to one or more embodiments of the present disclosure.

1. The grating panel may be disposed between the array substrate and the OLED layer. As shown in FIG. 6A, an example is shown in which the optical sensor array 410 and the array substrate 110 are in the same layer, the grating panel 420 may be disposed between the array substrate 110 and the OLED layer 120.

Figure 6B:
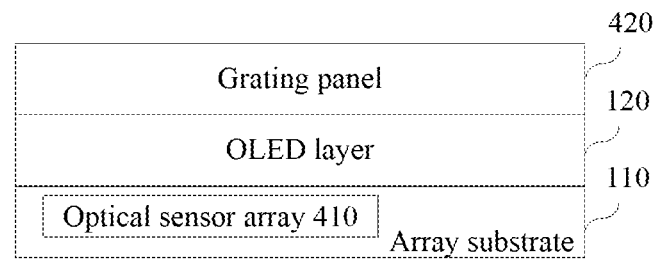
FIG. 6B is a structure diagram illustrating a display panel according to one or more embodiments of the present disclosure.

2. The grating panel may be disposed above the OLED layer. As shown in FIG. 6B, an example is shown in which the optical sensor array 410 and the array substrate 110 are in the same layer, the grating panel 420 may be disposed above the OLED layer 120.

Here, the optical shading area of the grating panel is overlapped with the transparent electrode areas. The optical shading area is not overlapped with the TFT areas.

Figure 6C:
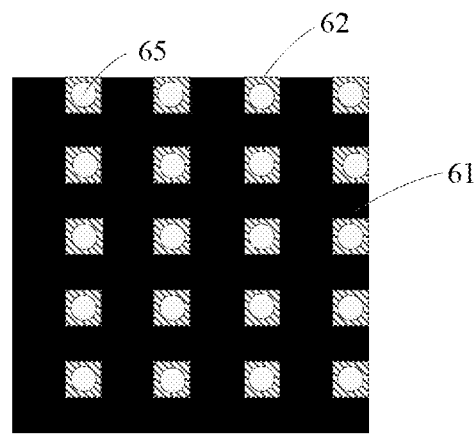
FIG. 6C is a diagram illustrating a display area of a display panel according to one or more embodiments of the present disclosure.

Optionally, the optical shading area of the grating panel is completely overlapped with the transparent electrode areas. As shown in FIG. 6C, the black area 61 may be the optical shading area. The transparent electrode areas may be under the optical shading area. The optical shading area is not overlapped with the optical sensing area 62 of the optical sensors. The optical sensing area 62 may be the TFT areas. Each TFT area may be disposed with an optical sensor 65.

Optionally, the optical shading area of the grating panel is overlapped with a portion of the transparent electrode areas.

Figure 6D:
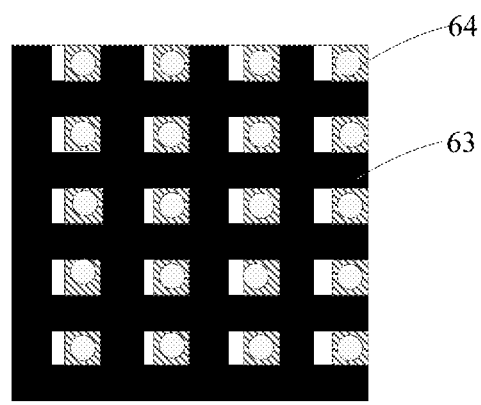
FIG. 6D is a diagram illustrating a display area of a display panel according to one or more embodiments of the present disclosure.

As shown in FIG. 6D, the black area 63 may be the optical shading area. The transparent electrode areas may be under the optical shading area 63. The optical shading area 63 is overlapped with a portion of the transparent electrode areas. The optical shading area 63 is not overlapped with the optical sensing area 64 of the optical sensors.

In one or more embodiments, the image display panel may be a LCD panel. The position of the grating panel in the display panel may have a connection with the position of the optical sensor array.

1. The optical sensor array 410 is disposed on a same layer as the array substrate 330. The position of the grating panel 420 in the display panel may have four different cases.

Figure 7A:
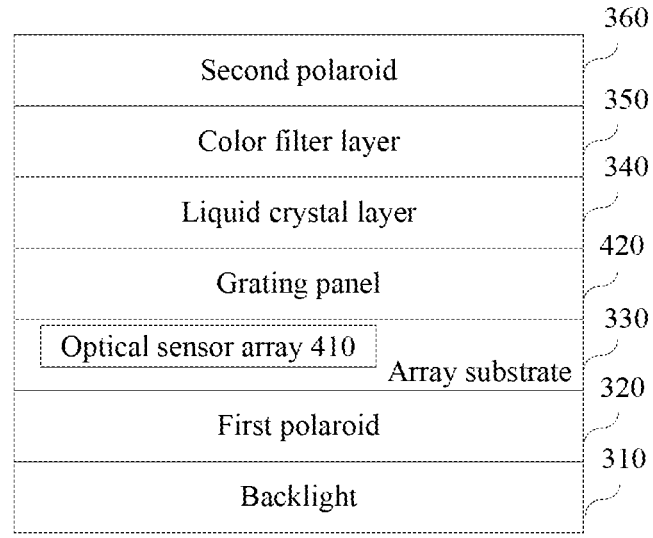
FIG. 7A is a structure diagram illustrating a display panel according to one or more embodiments of the present disclosure.

1). The grating panel may be disposed between the array substrate and the liquid crystal layer. As shown in FIG. 7A, the grating panel 420 may be disposed between the array substrate 330 and the liquid crystal layer 340.

Figure 7B:
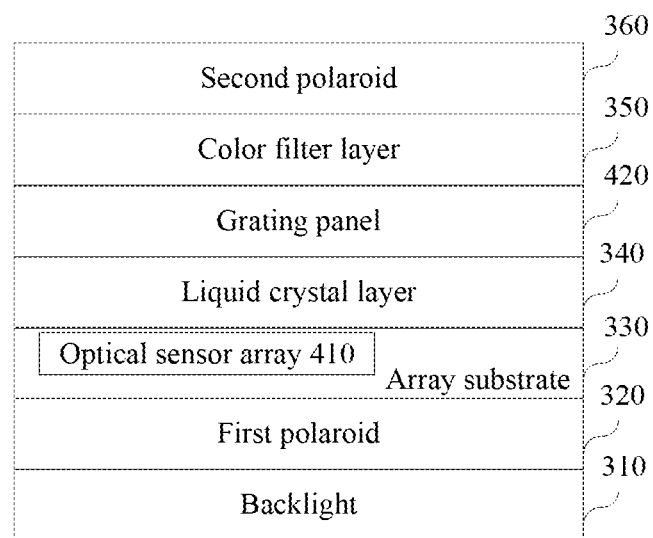
FIG. 7B is a structure diagram illustrating a display panel according to one or more embodiments of the present disclosure.

2). The grating panel may be disposed between the liquid crystal layer and the color filter layer. As shown in FIG. 7B, the grating panel 420 may be disposed between the liquid crystal layer 340 and the color filter layer 350.

Figure 7C:
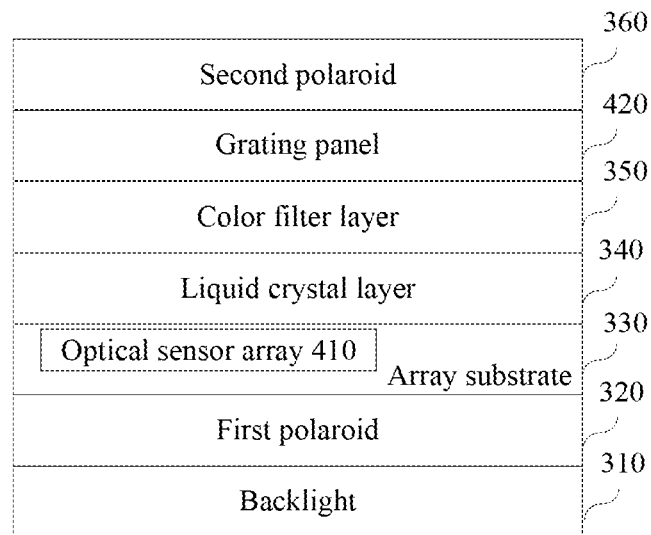
FIG. 7C is a structure diagram illustrating a display panel according to one or more embodiments of the present disclosure.

3). The grating panel may be disposed between the color filter layer and the second polaroid. As shown in FIG. 7C, the grating panel 420 may be disposed between the color filter layer 350 and the second polaroid 360.

Figure 7D:
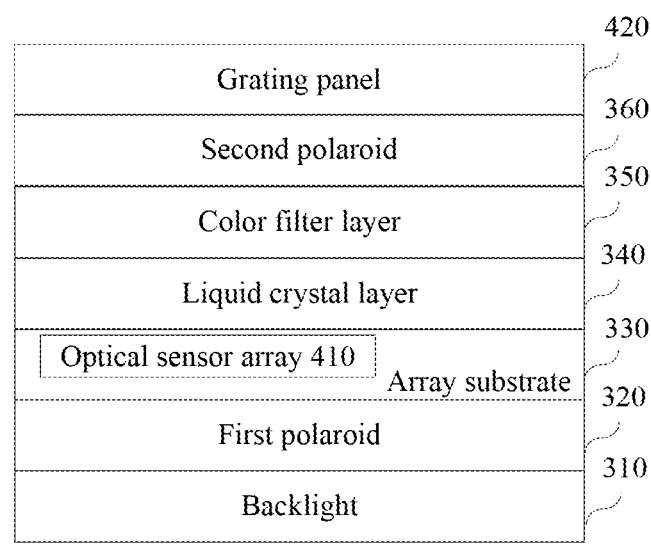
FIG. 7D is a structure diagram illustrating a display panel according to one or more embodiments of the present disclosure.

4). The grating panel may be disposed above the second polaroid. As shown in FIG. 7D, the grating panel 420 may be disposed above the second polaroid 360.

2. The optical sensor array 410 is disposed between the array substrate 330 and the liquid crystal layer 340. The position of the grating panel in the display panel may have four different cases.

Figure 7E:
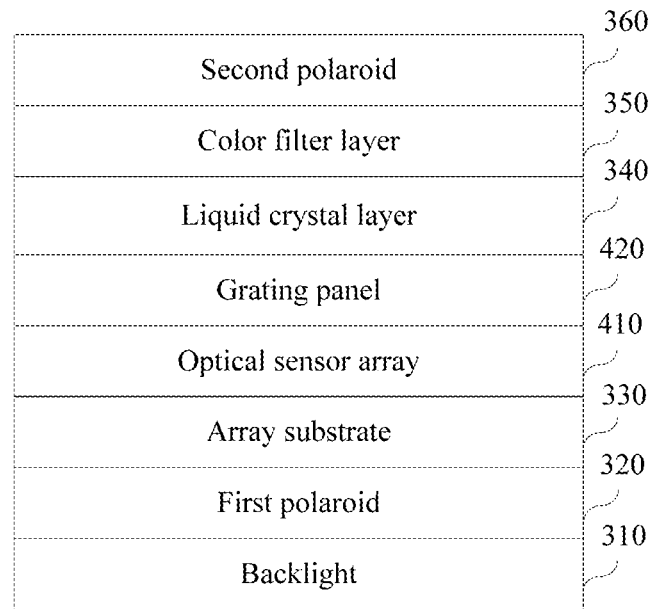
FIG. 7E is a structure diagram illustrating a display panel according to one or more embodiments of the present disclosure.

1). The grating panel may be disposed between the optical sensor array and the liquid crystal layer. As shown in FIG. 7E, the grating panel 420 may be disposed between the optical sensor array 410 and the liquid crystal layer 340.

Figure 7F:
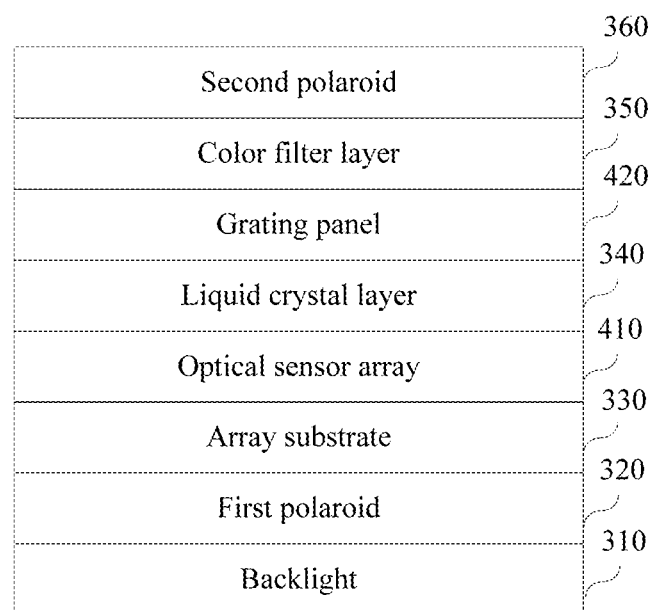
FIG. 7F is a structure diagram illustrating a display panel according to one or more embodiments of the present disclosure.

2). The grating panel may be disposed between the liquid crystal layer and the color filter layer. As shown in FIG. 7F, the grating panel 420 may be disposed between the liquid crystal layer 340 and the color filter layer 350.

Figure 8A:
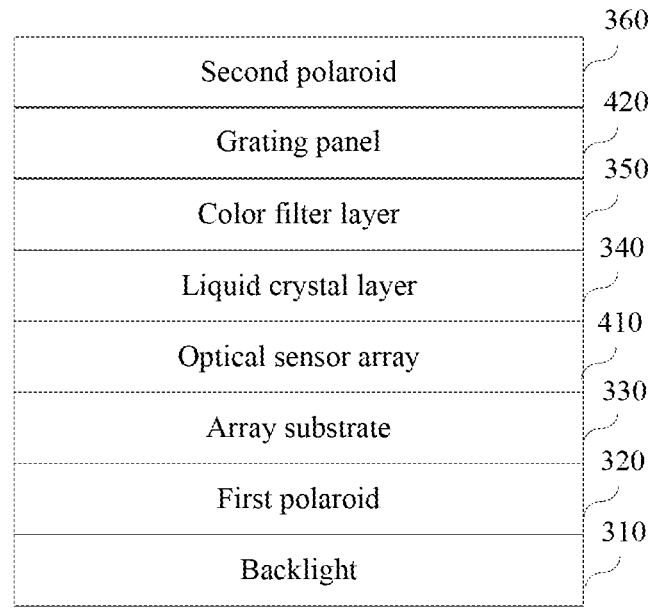
FIG. 8A is a structure diagram illustrating a display panel according to one or more embodiments of the present disclosure.

3). The grating panel may be disposed between the color filter layer and the second polaroid. As shown in FIG. 8A, the grating panel 420 may be disposed between the color filter layer 350 and the second polaroid 360.

Figure 8B:
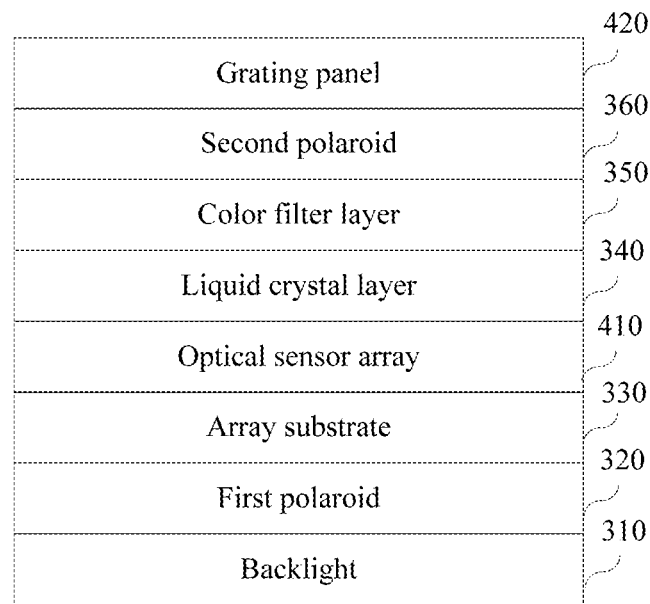
FIG. 8B is a structure diagram illustrating a display panel according to one or more embodiments of the present disclosure.

4). The grating panel may be disposed above the second polaroid. As shown in FIG. 8B, the grating panel 420 may be disposed above the second polaroid 360.

3. The optical sensor array 410 is disposed between the liquid crystal layer 340 and the color filter layer 350. The position of the grating panel in the display panel may have two different cases.

Figure 8C:
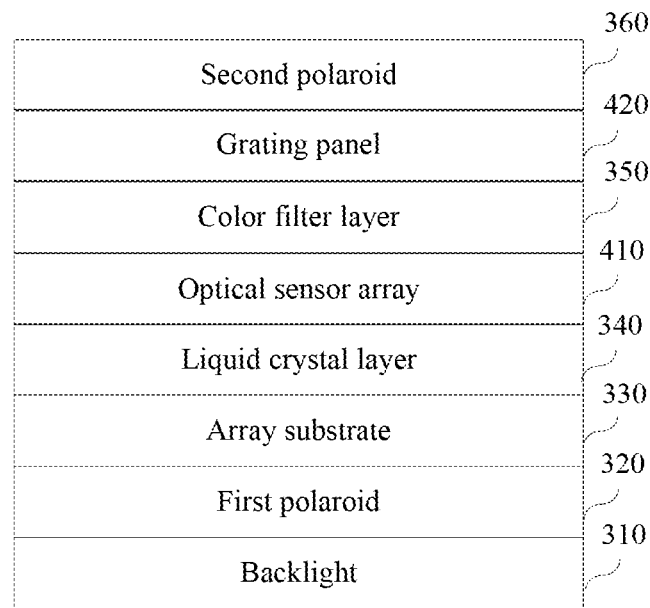
FIG. 8C is a structure diagram illustrating a display panel according to one or more embodiments of the present disclosure.

1). The grating panel may be disposed between the color filter layer and the second polaroid. As shown in FIG. 8C, the grating panel 420 may be disposed between the color filter layer 350 and the second polaroid 360.

Figure 8D:
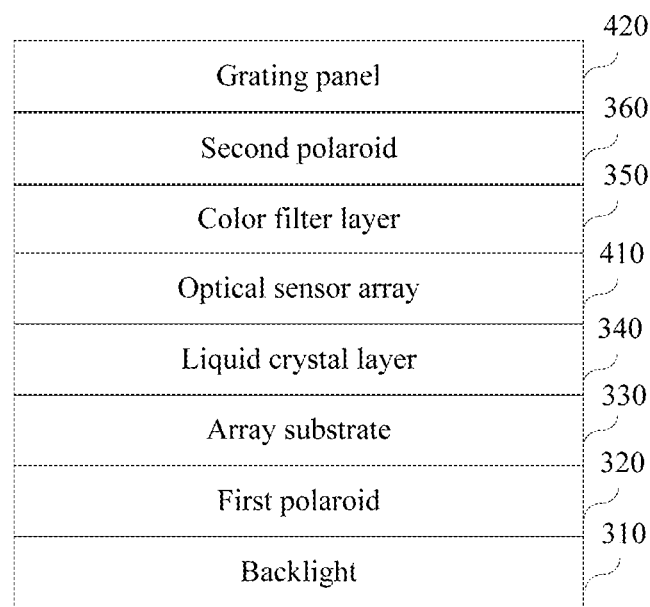
FIG. 8D is a structure diagram illustrating a display panel according to one or more embodiments of the present disclosure.

2). The grating panel may be disposed above the second polaroid. As shown in FIG. 8D, the grating panel 420 may be disposed above the second polaroid 360.

Here, the optical shading area of the grating panel is overlapped with the transparent electrode areas. The optical shading area is not overlapped with the TFT areas.

Optionally, the optical shading area of the grating panel is completely overlapped with the transparent electrode areas.

Optionally, the optical shading area of the grating panel is overlapped with a portion of the transparent electrode areas.

Figure 9A:
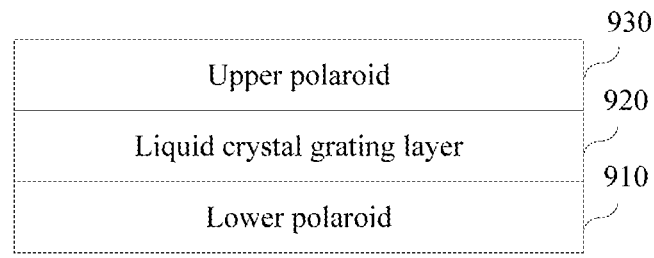
FIG. 9A is a structure diagram illustrating a grating panel according to one or more embodiments of the present disclosure.
Figure 9B:
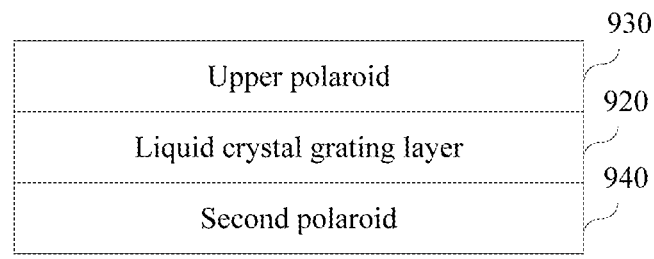
FIG. 9B is a structure diagram illustrating a grating panel according to one or more embodiments of the present disclosure.
Figure 9C:
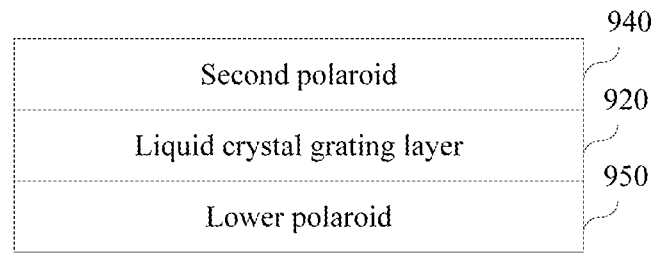
FIG. 9C is a structure diagram illustrating a grating panel according to one or more embodiments of the present disclosure.

In the display panel including the grating panel illustrated by FIG. 9A, 9B, or 9C, the display panel may include a liquid crystal grating control circuitry connected with the liquid crystal grating of the grating panel. The liquid crystal grating control circuitry may be configured to control the state of the liquid crystal area of the liquid crystal grating layer of the grating panel.

Optionally, the liquid crystal grating control circuitry may include two electrodes. One electrode may be used to control the state of liquid crystals in horizontal direction of the liquid crystal area. Another electrode may be used to control the state of liquid crystals in vertical direction of the liquid crystal area.

Optionally, the liquid crystal grating control circuitry may include one electrode. The electrode may be used to control the state of liquid crystals in horizontal direction and liquid crystals in vertical direction of the liquid crystal area.

Figure 10:
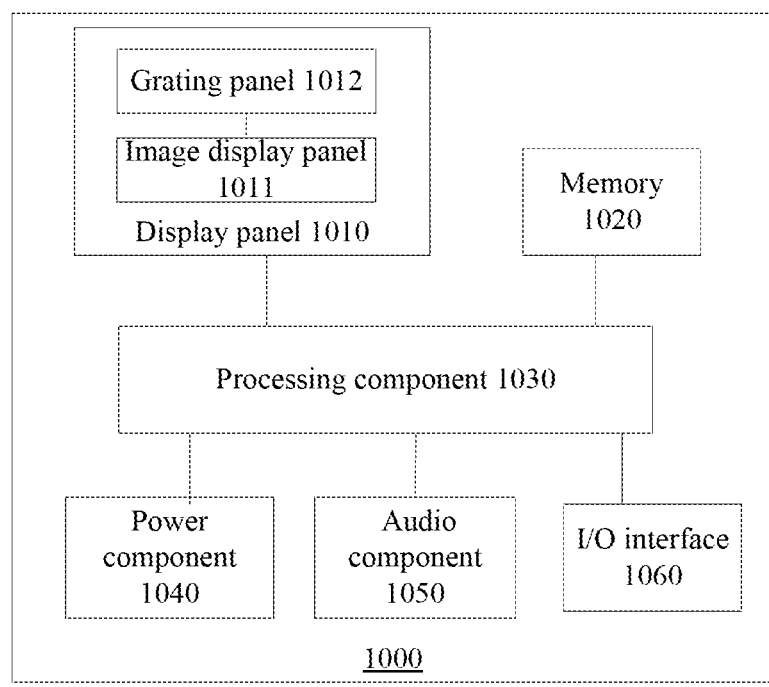
FIG. 10 is a block diagram illustrating a terminal according to one or more exemplary embodiments.

FIG. 10 is a block diagram illustrating a terminal according to an exemplary embodiment of the present disclosure. As shown in FIG. 10, the terminal 1000 may include a display panel 1010, a memory 1020, a processing component 1030, a power component 1040, an audio component 1050, and an input/output (I/O) interface 1060.

The display panel 1010 may be a display panel illustrated by anyone of FIG. 4, 6A, 6B, 7A, 7B, 7C, 7D, 7E, 7F, 8A, 8B, 8C, or 8D according to above embodiments.

The display panel 1010 may include an image display panel 1011 and a grating panel 1012 with a solid structure. The image display panel 1011 may include an optical sensor array (not shown).

The memory 1020 is configured to store various types of data to support the operation of the device 1000. Examples of such data include instructions for any applications or methods operated on the device 1000, contact data, phonebook data, messages, pictures, video, etc. The memory 1020 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The processing component 1030 typically controls overall operations of the device 1000, such as the operations associated with display, telephone calls, data communications, camera operations, and recording operations. The processing component 1030 may include one or more processors to execute instructions to perform all or part of the steps in the above described methods. Moreover, the processing component 1030 may include one or more modules which facilitate the interaction between the processing component 1030 and other components.

The power component 1040 provides power to various components of the device 1000. The power component 1040 may include a power management system, one or more power sources, and any other components associated with the generation, management, and distribution of power in the device 1000.

The audio component 1050 is configured to output and/or input audio signals. For example, the audio component 1050 includes a microphone ("MIC") configured to receive an external audio signal when the device 1000 is in an operation mode, such as a call mode, a recording mode and a voice recognition mode. The received audio signal may be further stored in the memory. In some embodiments, the audio component 1050 further includes a speaker to output audio signals.

The I/O interface 1060 provides an interface between the processing component 1030 and peripheral interface modules, such as a keyboard, a click wheel, buttons, and the like. The buttons may include, but are not limited to, a home button, a volume button, a starting button, and a locking button.

Figure 11:
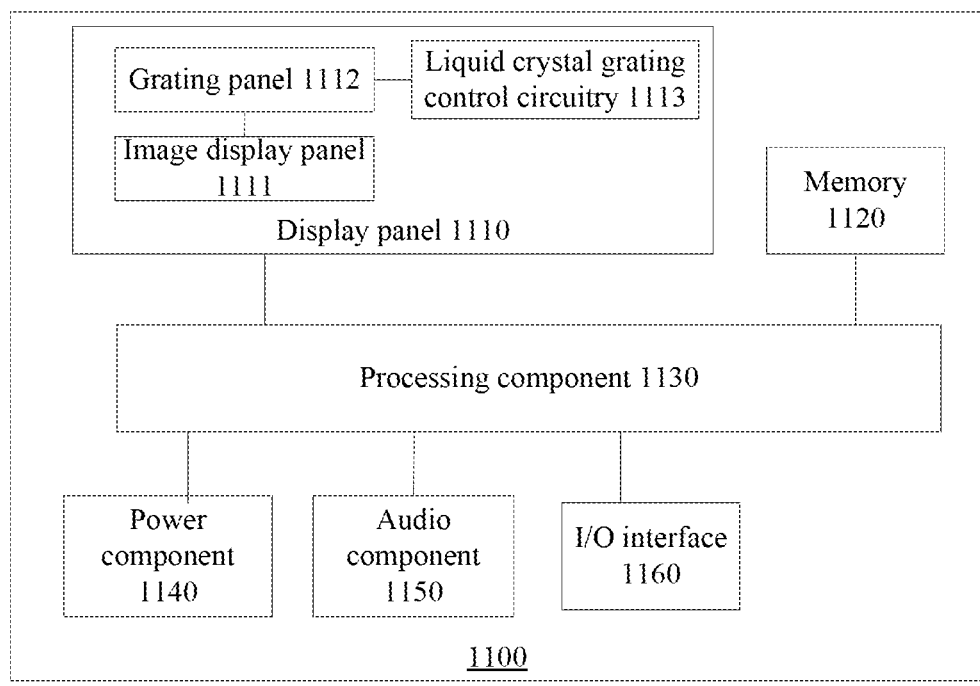
FIG. 11 is a block diagram illustrating a terminal according to one or more exemplary embodiments.

FIG. 11 is a block diagram illustrating a terminal according to an exemplary embodiment. As shown in FIG. 11, the terminal 1100 may include a display panel 1110, a memory 1120, a processing component 1130, a power component 1140, an audio component 1150, and an input/output (I/O) interface 1160.

The display panel 1110 may be a display panel illustrated by anyone of FIG. 4, 6A, 6B, 7A, 7B, 7C, 7D, 7E, 7F, 8A, 8B, 8C, or 8D according to above embodiments.

The display panel 1110 may include an image display panel 1111, a grating panel 1112 with a dynamic structure, and a liquid crystal grating control circuitry 1113 connected with the liquid crystal grating (not shown) of the grating panel 1112. The image display panel 1111 may include an optical sensor array (not shown).

The memory 1120 is configured to store various types of data to support the operation of the device 1100. Examples of such data include instructions for any applications or methods operated on the device 1100, contact data, phonebook data, messages, pictures, video, etc. The memory 1120 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The processing component 1130 typically controls overall operations of the device 1100, such as the operations associated with display, telephone calls, data communications, camera operations, and recording operations. The processing component 1130 may include one or more processors to execute instructions to perform all or part of the steps in the above described methods. Moreover, the processing component 1130 may include one or more modules which facilitate the interaction between the processing component 1130 and other components.

The power component 1140 provides power to various components of the device 1100. The power component 1140 may include a power management system, one or more power sources, and any other components associated with the generation, management, and distribution of power in the device 1100.

The audio component 1150 is configured to output and/or input audio signals. For example, the audio component 1150 includes a microphone ("MIC") configured to receive an external audio signal when the device 1100 is in an operation mode, such as a call mode, a recording mode and a voice recognition mode. The received audio signal may be further stored in the memory. In some embodiments, the audio component 1150 further includes a speaker to output audio signals.

The I/O interface 1160 provides an interface between the processing component 1130 and peripheral interface modules, such as a keyboard, a click wheel, buttons, and the like. The buttons may include, but are not limited to, a home button, a volume button, a starting button, and a locking button.

The embodiment of the present disclosure provides a method for display control. The embodiment illustrates the method for display control applied in a terminal, which includes a grating panel illustrated by FIG. 9A, 9B, or 9C in the display panel.

The liquid crystals of the liquid crystal grating layer of the grating panel may be controlled, by the liquid crystal grating control circuitry, to convert from an optical leaking state to an optical shading state when the optical sensor array is in operation.

The optical leaking state may be a state that light can completely pass through. The optical shading state may be a state that light cannot pass through or the transmittance is less than a predetermined value. Wherein, the predetermined value may be a value that is predetermined.

The liquid crystal grating layer of the grating panel may be in the optical leaking state when the optical sensor array is not in operation. When the optical sensor array is in operation, the terminal may control, by the liquid crystal grating control circuitry, the liquid crystal grating layer of the grating panel to convert from the optical leaking state to the optical shading state. Further, the terminal may control the liquid crystal grating layer to stay in this state.

In case that the optical sensor array is in operation, the terminal collects images by using the optical sensors. In order to guarantee that the optical sensor array is not affected by light that is not in vertical direction during the optical sensor array is collecting images, the light that is not in vertical direction should be shaded. Accordingly, the liquid crystal grating layer of the liquid crystal grating panel should be in the optical shading state.

In case that the optical sensor array is not in operation, the terminal does not collect images by using the optical sensors. The image display panel may desire to display images. If the liquid crystal grating layer of the liquid crystal grating panel is in the optical leaking state, the images displayed by the image display panel may be shaded. Accordingly, in order not to affect the image display during the optical sensors are not in operation, the liquid crystal grating layer should be in the optical leaking state.

The problems that images collected by the optical sensors for collecting images in the display panel of the mobile terminal have bad contrast ratio, bad saturability, and bad display quality are solved. The contrast ratio and saturability of the images collected by the optical sensors are improved, and the quality of the images is guaranteed.

The terminology used in the present disclosure is for the purpose of describing exemplary embodiments only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an embodiment is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

Other embodiments of the invention will be apparent to those skilled in the art from consideration of the specification and practice of the disclosures herein. This application is intended to cover any variations, uses, or adaptations of the disclosure following the general principles thereof and including such departures from the present disclosure as come within known or customary practice in the art. It is intended that the specification and embodiments be considered as illustrative only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the invention only be limited by the appended claims.

What is claimed is:

1. A display panel, comprising:
an image display panel;
an optical sensor array disposed in the image display panel, wherein the optical sensor array comprises a plurality of optical sensors arranged in an array; and
a grating panel disposed above the optical sensor array, wherein the grating panel comprises an optical shading area that complements to and is not overlapped with an optical sensing area of the optical sensors such that the optical shading area prevents light diagonally against the optical sensors; and the optical sensing area of the optical sensors and the optical shading area of the grating panel complement each other, such that the optical sensing area of the optical sensors adding the optical shading area of the grating panel is substantially a display area of the display panel, and wherein the grating panel comprises a liquid crystal grating layer, and the liquid crystal grating layer is in an optical leaking state when the optical sensor array is not in operation.

2. The display panel of the claim 1, wherein the image display panel comprises an array substrate and an Organic Light Emitting Display (OLED) layer above the array substrate;
wherein the array substrate comprises m*n subpixel units, and the subpixel units comprise respective transparent electrode areas and Thin Film Transistor (TFT) areas;
wherein the optical sensor array comprises a*b optical sensors, and each optical sensor is disposed in the TFT area of a corresponding subpixel unit; and
wherein, a is not greater than m, b is not greater than n.

3. The display panel of the claim 2, wherein the optical sensor array is disposed on a same layer as the array substrate, and the grating panel is disposed between the array substrate and the OLED layer.

4. The display panel of the claim 2, wherein the optical sensor array is disposed between the array substrate and the OLED layer, and the grating panel is disposed above the OLED layer.

5. The display panel of the claim 2, wherein the optical shading area of the grating panel is overlapped with the transparent electrode areas.

6. The display panel of the claim 1, wherein the image display panel comprises a backlight, an array substrate above the backlight, a liquid crystal layer above the array substrate, a color filter layer above the liquid crystal layer, and a polaroid above the color filter layer;
the optical sensor array is disposed on a same layer as the array substrate; or
the optical sensor array is disposed between the array substrate and the liquid crystal layer; or
the optical sensor array is disposed between the liquid crystal layer and the color filter layer;
wherein the array substrate comprises m*n subpixel units, and the subpixel units comprise respective transparent electrode areas and Thin Film Transistor (TFT) areas;
the optical sensor array comprises a*b optical sensors, and each optical sensor is disposed in the TFT area of a corresponding subpixel unit; and
wherein, a is not greater than m, b is not greater than n.

7. The display panel of the claim 6, wherein,
in the case that the optical sensor array is disposed on a same layer as the array substrate, the grating panel is disposed above the array substrate;
in the case that the optical sensor array is disposed between the array substrate and the liquid crystal layer, the grating panel is disposed between the optical sensor array and the liquid crystal layer or above the liquid crystal layer;
in the case that the optical sensor array is disposed between the liquid crystal layer and the color filter layer, the grating panel is disposed between the optical sensor array and the color filter layer or above the color filter layer;
wherein the optical shading area of the grating panel is overlapped with the transparent electrode areas.

8. The display panel of claim 6, wherein the grating panel is disposed above the polaroid of the image display panel, and comprises the liquid crystal grating layer and an upper polaroid above the liquid crystal grating layer.

9. The display panel of claim 6, wherein the grating panel is disposed between the color filter layer and the polaroid, and comprises the liquid crystal grating layer below the polaroid and a lower polaroid below the liquid crystal grating layer.

10. The display panel of claim 6, wherein the liquid crystal grating layer comprises a liquid crystal area and an optical leaking area, and the liquid crystal area is overlapped with the transparent electrode areas.

11. The display panel of claim 1, wherein the grating panel comprises the optical shading area and an optical leaking area, and the optical shading area is overlapped with the transparent electrode areas.

12. The display panel of claim 1, wherein the grating panel comprises a lower polaroid, the liquid crystal grating layer above the lower polaroid, and an upper polaroid above the liquid crystal grating layer;
wherein the liquid crystal grating layer comprises a liquid crystal area and an optical leaking area, and the liquid crystal area is overlapped with the transparent electrode areas.

13. The display panel of claim 12, wherein the display panel further comprises a liquid crystal grating control circuitry connected with the liquid crystal grating layer.

14. A terminal, comprising a display panel comprising:
an image display panel;
an optical sensor array disposed in the image display panel, wherein the optical sensor array comprises a plurality of optical sensors arranged in an array; and
a grating panel disposed above the optical sensor array, wherein the grating panel comprises an optical shading area that complements to and is not overlapped with an optical sensing area of the optical sensors such that the optical shading area prevents light diagonally against the optical sensors; and the optical sensing area of the optical sensors and the optical shading area of the grating panel complement each other, such that the optical sensing area of the optical sensors adding the optical shading area of the grating panel is substantially a display area of the display panel, and wherein the grating panel comprises a liquid crystal grating layer, and the liquid crystal grating layer is in an optical leaking state when the optical sensor array is not in operation.

15. The terminal of the claim 14, wherein the image display panel comprises an array substrate and an Organic Light Emitting Display (OLED) layer above the array substrate;
wherein the array substrate comprises m*n subpixel units, and the subpixel units comprise respective transparent electrode areas and Thin Film Transistor (TFT) areas;
wherein the optical sensor array comprises a*b optical sensors, and each optical sensor is disposed in the TFT area of a corresponding subpixel unit; and
wherein, a is not greater than m, b is not greater than n.

16. The terminal of the claim 15, wherein the optical sensor array is disposed between the array substrate and the OLED layer, and the grating panel is disposed above the OLED layer.

17. The terminal of the claim 15, wherein the optical shading area of the grating panel is overlapped with the transparent electrode areas.

18. The terminal of the claim 15, wherein the optical sensor array is disposed on a same layer as the array substrate, and the grating panel is disposed between the array substrate and the OLED layer.

19. The terminal of claim 14, wherein the grating panel comprises the optical shading area and an optical leaking area, and the optical shading area is overlapped with the transparent electrode areas.

20. The terminal of claim 14, wherein the grating panel comprises a lower polaroid, the liquid crystal grating layer above the lower polaroid, and an upper polaroid above the liquid crystal grating layer;
wherein the liquid crystal grating layer comprises a liquid crystal area and an optical leaking area, and the liquid crystal area is overlapped with the transparent electrode areas.

* * * * *